(12) United States Patent
Kamei et al.

(10) Patent No.: US 6,284,434 B1
(45) Date of Patent: Sep. 4, 2001

(54) PIEZOELECTRIC THIN FILM ELEMENT FABRICATION METHOD

(75) Inventors: Hiroyuki Kamei; Tsutomu Nishiwaki; Makoto Matsuzaki; Masato Shimada; Akira Matsuzawa, all of Nagano (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/175,319

(22) Filed: Oct. 20, 1998

(30) Foreign Application Priority Data

Oct. 20, 1997 (JP) .................................................... 9-286823
Oct. 5, 1998 (JP) .................................................. 10-282897

(51) Int. Cl.$^7$ ................................. G03F 7/00; G03F 7/40
(52) U.S. Cl. ......................... 430/319; 430/311; 430/315; 430/330
(58) Field of Search .................................. 430/311, 315, 430/319, 330

(56) References Cited

U.S. PATENT DOCUMENTS

| 5,719,417 | * | 2/1998 | Roeder  | 257/295 |
| 5,814,923 | * | 9/1998 | Shimada | 310/800 |

FOREIGN PATENT DOCUMENTS

| 0 709 200 A1 | 5/1996 | (EP) . |
| 0 782 923 A1 | 7/1997 | (EP) . |
| 0 794 579    | 9/1997 | (EP) . |
| 8-77668      | 3/1996 | (JP) . |
| 8-252914     | * 10/1996 | (JP) . |
| 8-306980     | * 11/1996 | (JP) . |

OTHER PUBLICATIONS

Samura, Hideo, Line Head for Ink Jet Printer, JPAB Abstract 2000–79685, Mar. 2000.*
European Search Report, Aug. 25, 2000.
W–Ping Xu, et al., Application of Hydrothermal Mechanism for Tailor–Making Perovskite Titanate Films, IEEE Proc. Of $9^{th}$ International Symp. on Electrets, Sep. 25–30 (1996), pp. 617–622.
Huaping Xu et al., A Novel Soft–Chemistry Route to the Synthesis of PZT Perovskite Films, 2p–PA–11, p. 512 (Abstract Only).

* cited by examiner

Primary Examiner—Mark F. Huff
Assistant Examiner—Nicole Barreca
(74) Attorney, Agent, or Firm—Sterne, Kessler, Goldstein & Fox, P.L.L.C.

(57) ABSTRACT

A piezoelectric thin film element is provided that functions well as an actuator, that yields the desired composition, and that exhibits good piezoelectric thin film distortion characteristics. A lower electrode is formed on a substrate, a piezoelectric thin film precursor thin film layer is formed on the lower electrode, this is subjected to patterning, and a heating solution is applied to the substrate to implement hydrothermal processing, thereby selectively crystallizing the precursor thin film layer and yielding a piezoelectric thin film layer.

9 Claims, 4 Drawing Sheets

FIG.1
(1)
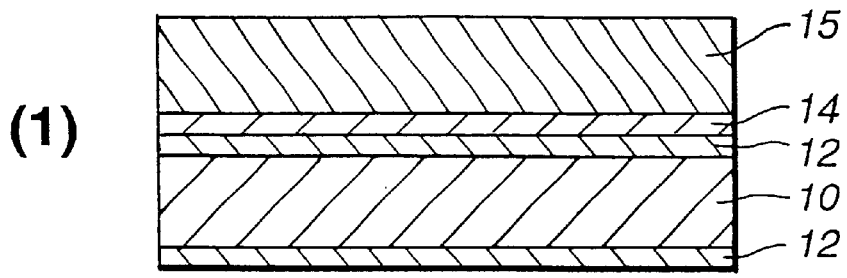
(2)
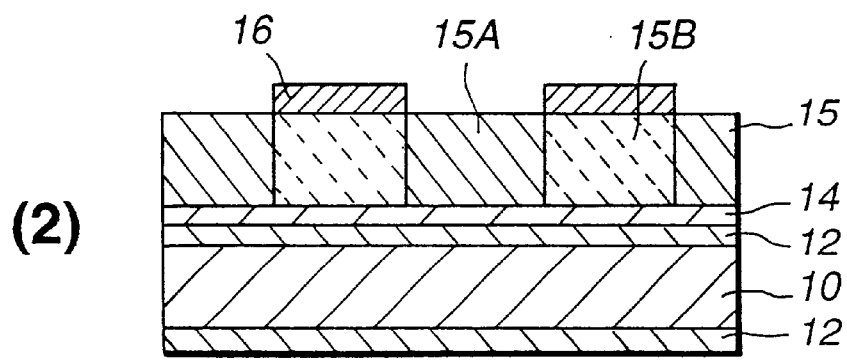
(3)
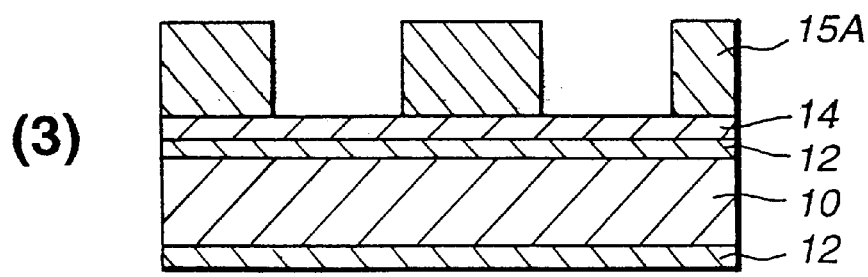
(4)
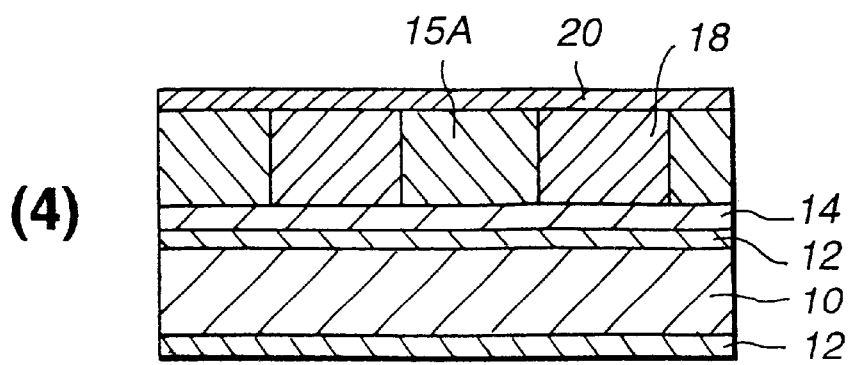

PIEZOELECTRIC THIN FILM ELEMENT FABRICATION METHOD

BACKGROUND OF THE INVENTION

1. Field of the Invention

This invention concerns a piezoelectric thin film element, and more particularly concerns the manufacture of ink jet recording heads used in ink jet recording apparatuses.

2. Related Art

In forming piezoelectric thin film typified by plumbum (lead) zirconate titanate (PZT), a piezoelectric thin film is first formed on a substrate by a sputtering method such as physical vapor deposition (PVD), chemical vapor deposition (CVD), or a sol-gel method such as spin coating, and this is subjected to a heat treatment at a high temperature of from 700° to 1000° C.

In seeking to increase the film thickness of piezoelectric thin film, methods attempted have included increasing the accumulation time for film growing and repeating the film growing operation a number of times.

Another method of increasing the film thickness of piezoelectric thin films that is being studied is that of hydrothermal synthesis (known also as "hydrothermal processing"), wherein a reaction for growing the piezoelectric thin film is promoted in a low-temperature environment at 200° C. or lower.

This hydrothermal processing method comprises a seed crystal formation process wherein PZT seed crystals are deposited on the surface of a titanium metal substrate, and a crystal growth process wherein additional PZT crystals are deposited and grown above the PZT seed crystal. This method is set forth, for example, in "Suinetsu goseiho ni yoru PZT kesshomaku no sakusei to sono denki tokusei (Preparation of PZT crystal films by hydrothermal synthesis, and electrical properties thereof)," a research paper recently published in the collected papers presented at the 15th Electronic Materials Research Forum of The Ceramic Society of Japan.

Manufacturing piezoelectric thin films by a sputtering method or sol-gel method requires heat treatment at high temperature, making such methods unsuitable for the fabrication of films of 1μ or greater thickness, requiring, as they do, considerably long times for film formation, and, even when thicker films are realized, resulting in problems such as the development of cracks. When a piezoelectric thin film is used as an element employed in an ink jet recording apparatus, film thickness of from 0.5μ to 10μ or so are preferred. Thus it is needful to prevent the problems noted from occurring. Accordingly, it is possible to employ the hydrothermal processing method wherewith thick films can be made at low temperature, but when this method is used it is very difficult to control the composition of the piezoelectric thin film within an optimal range.

With the hydrothermal method alone, moreover, the crystals in the piezoelectric thin film layer become several μ in diameter, whereupon fine, smooth films cannot be obtained, and fine patterning cannot be done, for which reasons deficiencies and other problems arise in the piezoelectric thin films.

SUMMARY OF THE INVENTION

An object of the present invention is to provide a piezoelectric thin film element that functions well as an actuator, and wherewith the desired composition is obtained, good piezoelectric body distortion characteristics are exhibited, and the problems noted above are resolved.

Another object of the present invention is to provide a piezoelectric thin film element exhibiting the desired film thickness, wherein cracks do not develop in the piezoelectric thin film layer.

Another object of the present invention is to provide a piezoelectric thin film element wherewith there is no danger of deficiencies developing in the piezoelectric film.

Another object of the present invention is to provide an ink jet recording head that uses the piezoelectric thin film element of the present invention, and an ink jet printer that uses that head.

The Applicant has already, in Patent Application H8-77668/1996 (European Laid-Open Patent Application 794579A), proposed that, following the use of a sol-gel method to form a seed crystal layer for obtaining a piezoelectric thin film, a piezoelectric thin film layer be formed by hydrothermal processing.

The Inventors perfected the present invention after discovering that the objects stated above can be realized by using a sol-gel method to form a thin film layer consisting of a piezoelectric precursor, and then crystallizing the precursor thin film layer using hydrothermal processing. In doing so, the Inventors made reference to a recently published paper entitled "Application of Hydrothermal Mechanism for Tailor-making Perovskite Titanate Films," IEEE Proc. of the 9th Int'l Symp. On Electrets Shanghai China, Sep. 25–30 (1996), pp 617–622, W-ping Ku, Masanori Okuyama, et al.

In other words, the present invention is a method of manufacturing a piezoelectric thin film element by forming, on a substrate, a lower electrode layer, a piezoelectric thin film layer, and then an upper electrode layer, wherein a piezoelectric body precursor thin film layer is formed by a sol-gel method, MOD method, sputtering method, or CVD method on the lower electrode, after which the hydrothermal processing method is implemented, that is, the substrate on which the precursor thin film is formed is immersed into a heating solution to implement hydrothermal processing and the precursor thin film is crystallized.

The main aspect of the present invention involves patterning the precursor noted earlier, by photolithography or the like, and crystallizing it. In other words, it involves forming a mask pattern on the precursor thin film layer, removing the unnecessary portions of the precursor layer, and then processing this substrate in the heating solution noted earlier.

In one aspect of the present invention, a mask pattern is formed on the precursor thin film layer to pattern the thin film layer, after which the hydrothermal process noted earlier is applied, thereby crystallizing the areas of the thin film layer whereon no mask pattern has been formed.

Another aspect of the present invention is characterized in that a sol is used for forming a precursor exhibiting photosensitivity. More specifically, the sol is applied to a substrate to form the precursor thin film, which thin film is selectively exposed to light, thereby patterning the precursor. The patterned precursor is then crystallized in a heating solution. This precursor sol may comprise, for example, a mixture of a liquid-form photosensitive resist and the sol for forming the piezoelectric body precursor thin film.

In another aspect of the present invention, after forming a lower electrode layer on a substrate, a crystal layer comprising seeds or a layer of seeds for promoting the crystallization of the precursor is formed on the lower electrode, after which a precursor thin film layer is formed on the seed crystal layer. Then the precursor thin film is crystallized in a heating solution.

In a variation of this aspect, a precursor thin film is formed on the substrate by a sol-gel method, on top of which the seeds or seed layer noted above is formed, after which the precursor pattern is crystallized in a heating solution. In yet another variation, in the process of forming multiple layers of the precursor thin film, seeds or a layer of seeds is formed between the precursor thin films.

In yet another aspect of the present invention, the seeds noted above are mixed into the piezoelectric precursor thin film. The piezoelectric precursor thin film layer may be formed, for example, with a sol-gel method using a sol into which the seeds have been mixed as the sol for forming the precursor.

In yet another aspect of the present invention, the element constituting the seeds is mixed into a heating solution for hydrothermal processing. This heating solution is an alkaline aqueous solution, or the like, used in hydrothermal synthesis.

In yet another aspect of the present invention, the piezoelectric thin film element pertains to an ink jet recording head that is an actuator for the purpose of discharging ink inside an ink cavity provided in the substrate. Yet another aspect of the present invention is an ink jet printer that comprises this ink jet recording head.

In the present invention, moreover, by precursor is meant something that is in a state prior to the crystallization of the piezoelectric thin film, such as an amorphous body. As based on the present invention, it is possible to form films and patterns while the piezoelectric thin film is in a precursor state, thus making it possible to provide a piezoelectric thin film element exhibiting the desired film thickness without the occurrence of cracks in the piezoelectric thin film layer.

BRIEF DESCRIPTION OF THE FIGURES

FIGS. 1(1)–(4) are a set of cross-sectional views representing fabrication processes for a piezoelectric thin film element that concerns an embodiment of the present invention.

DETAILED DESCRIPTION OF THE PREFERRED EMBODIMENTS

Figure 2:
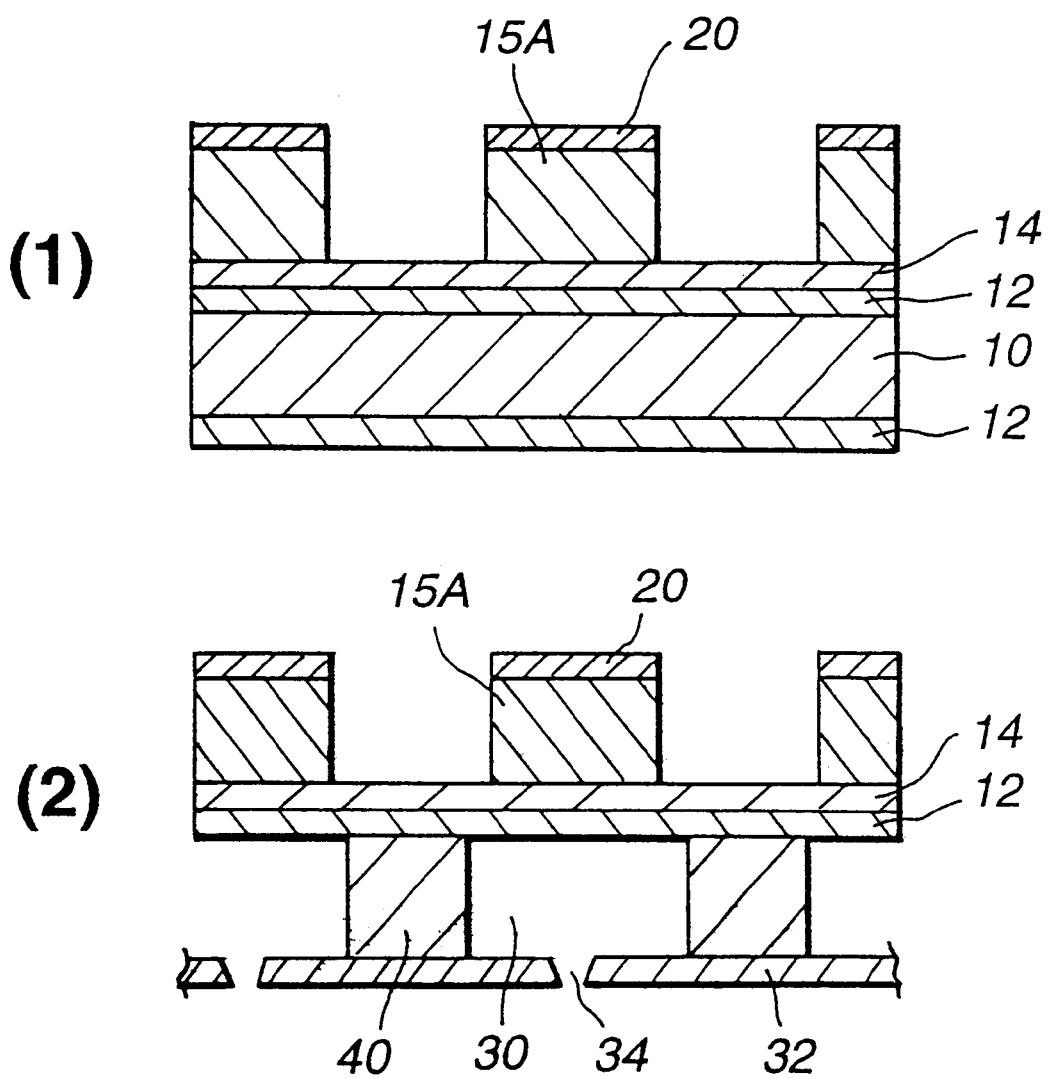
FIGS. 2(1) and (2) are a pair of cross-sectional views representing fabrication processes that are a continuation of the processes diagramed in FIG. 1.

Processes in the fabrication method of the present invention are diagramed in FIG. 1. In process (1), a monocrystalline silicon substrate 10 of thickness $200\mu$ having a facet orientation (crystal plane orientation) (110) is subjected to wet thermal oxidation to form a silicon oxide film 12 of a thickness ranging from about 0.3 to $1.2\mu$ on both sides of the silicon substrate.

Next, using a sputtering method, a titanium film (titanium or titanium oxide) having a thickness of from 0.005 to $0.04\mu$ or so is formed on the silicon oxide film 12. Then, using a sputtering method, a lower electrode 14 made of platinum is formed at a film thickness of about 0.2 to $0.8\mu$ on the titanium film.

Next, a PZT film is formed on the lower electrode 14, as the piezoelectric thin film, by a method reported in one of the papers discussed earlier.

First, using the sol-gel method indicated below, a two-component PZT precursor 15 is formed which is represented by the expression $Pb(Zr,Ti_{1-x})O_3+YpbO$ (where $0.40 \leq X \leq 0.6$ and $0 \leq Y \leq 0.1$). A commonly known three-component PZT precursor is also permissible.

With this fabrication method, a hydrate complex of a hydride having a metal component capable of forming a PZT layer, that is to say a sol, is subjected to a dehydration process to form a gel, and the PZT layer precursor layer 15 is formed.

The sol having the metal component for configuring the PZT film can be prepared by, for example, using an acid to hydrolyze an alcoxide or acetate of a metal capable of forming the PZT film. In other words, the raw material that one starts with is an alcoxide or acetate of titanium, zirconium, lead, or some other metal component, respectively.

The hydrothermal method here is only for the purpose of crystallizing the PZT precursor, wherefore an advantage is realized in that the composition of the metal components configuring the PZT film is maintained more or less intact until the finally polycrystallized PZT film (piezoelectric thin film) is obtained. In addition, the composition of the metal components in these departure-point raw materials will coincide with the metal composition in the PZT film ultimately obtained. The composition of the sol is determined according to the piezoelectric thin film that one is seeking to produce.

First, this sol composition is applied to the lower electrode 14 on which the PZT film is to be formed. There is no particular limitation on the method used for this application, which may be any commonly employed method, including spin coating, dip coating, roll coating, and bar coating. The application may also be done by flexographic printing, screen printing, or offset printing, etc.

The thickness of the film formed by this application should be roughly a thickness that will manifest the piezoelectric distortion characteristics sought, that is, from 0.5 to $10\mu$ (and preferably from 1 to $5\mu$) in the case of an ink jet recording head. The application process described above is performed sequentially a number of times, preferably from 3 to 10 times. Drying is performed in air at a temperature of 150° C. to 200° C. for 10 to 30 minutes in order to vaporize the solvent in the applied sol. Also, to separate and break down the organic material coordinated with the metal elements, the dried gel is pyrolyzed at 300 to 500° C. for 30 to 90 minutes.

After that, as diagramed at (2), a metal mask 16 exhibiting alkaline resistance is formed on the amorphous PZT precursor layer, forming a 300 to 500 nm nickel mask pattern, for example. This is then subjected to hydrothermal processing. That is, this substrate is immersed in an alkaline solution (containing almost no raw material components for forming the PZT), such as 0.5M $Ba(OH)_2$, for example, and is heated in an autoclave at 160° C. and 8 MPa.

When this is done, in the PZT layer, only the areas 15A where no mask pattern has been formed will be selectively crystallized, whereupon perovskite PZT crystals are formed. The heated aqueous alkaline solution does not permeate to the PZT precursor 15B in the areas where the mask is formed, so these portions are not crystallized.

Next, as diagramed at (3), this substrate is immersed in an aqueous solution of nitric acid having a concentration of 10% by weight at 60° C. until the mask pattern has been removed. The immersion time will be 30 to 50 seconds when the nickel film thickness is 300 nm. The substrate is then immersed in an aqueous solution of sulfuric acid having a concentration of 25% by weight at 60° C. for from 30 seconds to 2 minutes, removing only the portions of the amorphous-state PZT layer 15B that are in the area not crystallized.

Next, as in the process diagramed at (4), the removed uncrystallized PZT 15B portions are filled in by laminating layers of photoresist 18, making the surface flat. Then a layer 20 is formed for the upper electrode, almost the same as when the lower electrode 14 was formed. Then, using a lift-off method, as diagramed at (1) in FIG. 2, this photoresist 18 is selectively removed, forming the upper electrode 20 only on the piezoelectric thin film layer 15A.

Next, as diagramed at (2) in FIG. 2, photoresist is formed on the other side of the substrate, opposite the side where the PZT thin film layer is, in which resist are formed openings at prescribed positions. Using this resist with the openings formed in it as a mask, the silicon dioxide film 12 on the side opposite from the PZT thin film layer is patterned using a liquid mixture of hydrofluoric acid and ammonium fluoride.

Next, protecting the surface on which the piezoelectric thin film is formed by an apparatus, this is soaked in an aqueous solution of potassium hydroxide to perform anisotropic etching on the monocrystalline silicon substrate 10 and form an ink chamber 30.

When potassium hydroxide is used as the etching solution, the etching rate ratio between the (110) and (111) planes in the monocrystalline silicon becomes about 300:1, and the side etching that occurs when forming channels having the depth of the 200$\mu$, thickness of the monocrystalline substrate can be suppressed, wherefore the ink chamber 30 can be formed with high precision.

Following this, with the protective apparatus still in place, the silicon dioxide film on the lower surface of the silicon substrate 40 adjacent to the ink chamber 30 is removed by etching with a liquid mixture of hydrofluoric acid and ammonium fluoride. Then a nozzle plate 32 having discharge nozzles 34 in it is joined to the open side of the ink chamber 30 so obtained, and other desirable process steps are implemented to finish the ink jet recording head used in ink jet printers.

By implementing the ink jet recording head obtained according to this embodiment, a piezoelectric thin film layer precursor having the desired thickness is formed by a sol-gel process, and the hydrothermal method is only used to crystallize the precursor, wherefore the following benefits are realized.

The composition of the PZT film can be controlled in the sol-gel process. Since the process of crystallizing the PZT precursor is implemented in the low-temperature region made possible by the hydrothermal method, cracks do not occur in the PZT thin film layer. The PZT thin film layer is formed by a sol-gel process, yielding a fine, smooth film, and making it possible to prevent surface roughness from increasing.

With this embodiment, moreover, the unnecessary portions of the piezoelectric thin film can be disposed of by patterning the piezoelectric thin film prior to crystallization, wherefore, as compared to cases where patterning is done after crystallizing the piezoelectric thin film, as with the dry etching performed in commonly known sol-gel methods, the patterning process can be finished easily and quickly.

This embodiment can be modified in many different conceivable ways. Instead of forming a mask on the precursor thin film, for example, hydrothermal heating may be done in a heating solution after patterning the precursor thin film.

In order to make this possible, it is permissible to pattern the precursor thin film using an ordinary photolithographic process, or the sol used to form the precursor thin film of the photosensitive piezoelectric body may be used. Using this method, the patterning diagramed in FIG. 1(3) is performed, and the precursor thin film pattern is then crystallized in the aqueous heating solution. When this configuration is implemented, it is possible to increase the patterning processing liquid and the piezoelectric thin film contact surface area, to the extent that there is no mask, wherefore the crystallization rate can be raised by a factor of 1.5 to 2. This may be realized by using, for the photosensitive precursor sol, for example, a mixture of a photosensitive resist, such as an aqueous developing solution type of organic photoresist, and a commonly known precursor thin film sol raw material, mixed in a photosensitive resist to precursor sol volume proportion of 3:7 to 3:2 (but preferably 2:3 to 1:1).

Alternatively, after forming the upper electrode on the precursor thin film, both the upper electrode and the precursor thin film can be patterned together using an ordinary photolithographic procedure, followed by the application of hydrothermal processing. When this is done, the upper electrode is formed after the hydrothermal processing, making it possible to omit the process of filling in the portions where there is no PZT.

A second embodiment is now described. The second embodiment differs from the embodiment described above in that a PZT seed crystal layer is first formed on the lower electrode. In other words, prior to forming the precursor thin film layer 15 on the lower electrode layer 14, seed crystals are formed using the sol-gel method set forth in Patent Application H8-77668/1996 (European Laid-Open Patent Application 794579A) referred to earlier.

More specifically, the sol composition noted earlier is coated on one time in a film thickness of 100 nm. This is dried for 1 hour at 180° C., and pyrolyzed for 1 hour at 400° C. The substrate is then annealed, by RTA rapid thermal at 650° for 1 minute to yield a perovskite PZT seed crystal layer. The precursor thin film layer 15 is formed on this seed crystal layer by the procedure diagramed in FIG. 1.

For the seeds, either the configurational elements in the PZT or their oxides may be used, with the seeds preferably arranged in spots or islands rather than as a uniform film. The thickness should be from 1 to 10 nm, with a range of 4 to 6 nm being preferred. The element or elements used may be either one of the PZT configurating elements or a combination of a plurality thereof. The formation of the laminar layers in film form and the formation of the seed crystals may be done with a sputtering method.

It is also permissible to configure the precursor thin film layer on the lower electrode by a sol-gel procedure and form the seed crystals thereon by the method described in the foregoing. The precursor layer is progressively crystallized from these upper seed crystals during hydrothermal heating.

It is also permissible to implement the formation of the precursor thin film layer by the sol-gel method and the formation of the seeds or seed layer alternately. The film thicknesses of the precursor and seed layers at such time should be within ranges of 80 to 120 nm, and 4 to 6 nm, respectively. In terms of the number of laminations of each layer, moreover, the ratio of precursor layers to seed layers should be between 3:1 and 4:1.

As to other variations, either a configurational element or oxide thereof of the piezoelectric thin film, or a combination thereof, in the form of fine powder, may be mixed in a powder to precursor sol volumetric ratio of from 1:200 to 1:100, as the seeds in the piezoelectric thin film precursor sol, or this powder may be mixed with an aqueous alkaline solution in a powder to solution volumetric ratio of 1:200 to 1:100.

As a result, the patterned piezoelectric thin film precursor sol is crystallized on the basis of these mixed seed crystals.

By implementing this embodiment, the PZT precursor thin film is crystallized on the basis of the seed crystals during the course of the hydrothermal reaction, wherefore the benefit of raising the crystallization speed can be realized. That being so, the time needed for the hydrothermal reaction can be shortened, and the substrate prevented from being damaged by the aqueous alkaline solution.

The crystal grain size in the piezoelectric thin film ranges from $0.05\mu$ to $0.5\mu$, inclusively. If the piezoelectric thin film thickness exceeds $0.5\mu$, the necessary piezoelectic characteristics are realized in the ink jet recording head, for example, and, at a thickness below $10\mu$, the piezoelectric element can be formed with high precision. A thickness between 1 and $5\mu$ is preferable, and a thickness of $2\mu$ is even more preferable.

If the crystal grain size is $0.05\mu$ or greater, the necessary piezoelectric characteristics can be manifested. If the crystal grain size is $0.5\mu$ or smaller, the piezoelectric thin film element is susceptible to fine patterning. This value is realized by starting with seed crystals as kernels, and then crystallizing the piezoelectric thin film. Furthermore, by making the surface roughness $0.1\mu$ or less at Rmax, the upper electrode ran be made to thoroughly cover the piezoelectric thin film.

It is also within the scope of the disclosure of the present invention to appropriately combine the first and second embodiments, such as by combining, in a suitable order, the seed crystal formation process and the piezoelectric thin film patterning process.

Figure 3:
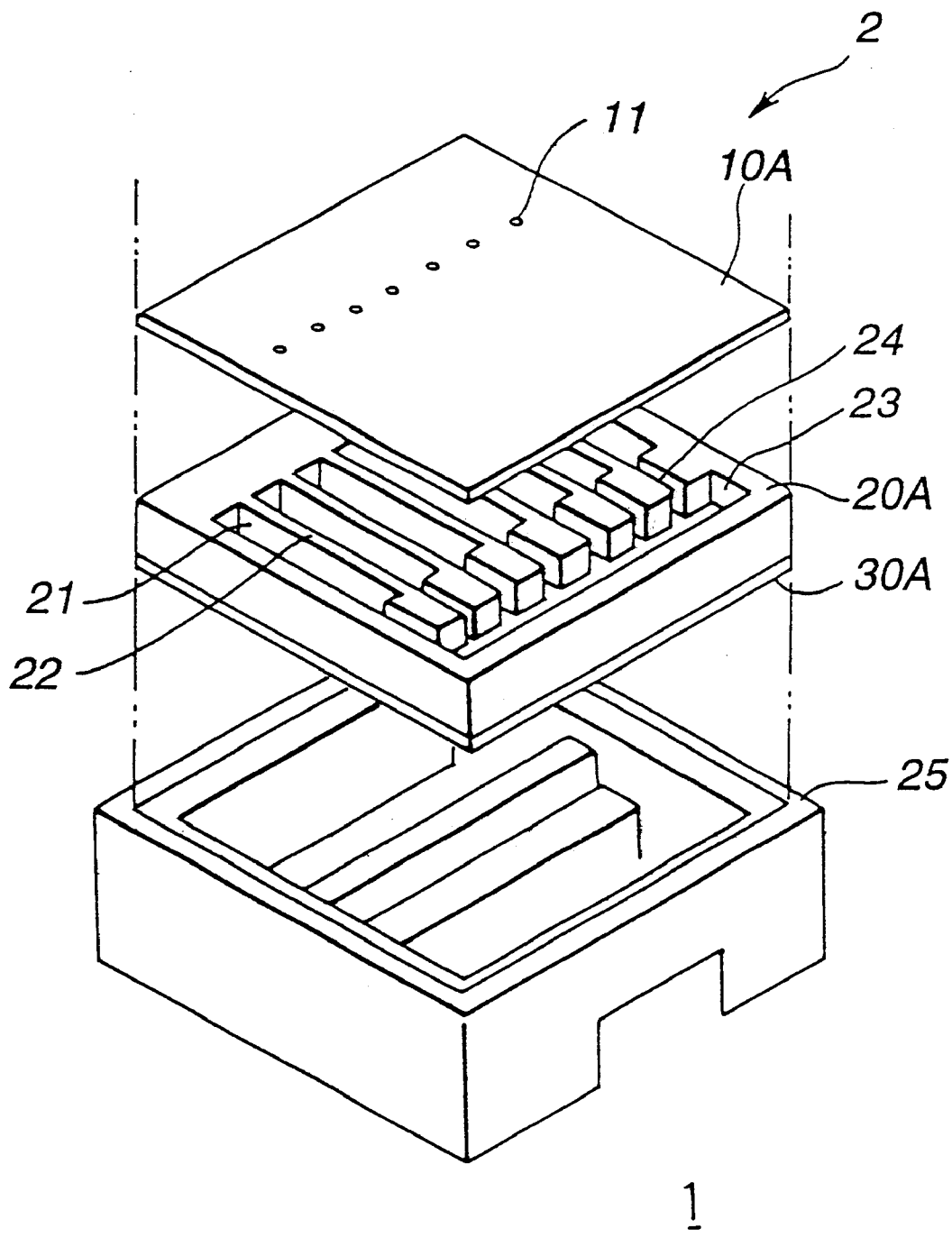
FIG. 3 is an exploded overall diagonal view of an ink jet recording head.

Specific examples wherein the present invention is applied are now described. In FIG. 3 is presented an overall exploded diagonal view of an ink jet recording head wherein a piezoelectric element obtained as described in the foregoing is used as an actuator.

The ink jet recording head 1 diagramed in FIG. 3 is of a type wherein the ink supply path is formed inside a pressure chamber substrate. As diagramed in the figure, the ink jet recording head primarily comprises a pressure chamber substrate 20A, a nozzle unit 2, and a base 25.

The pressure chamber substrate 20A, after being formed on a monocrystalline silicon substrate, is severally divided. A plurality of strip-like pressure chambers 21 are provided in the pressure chamber substrate 20A, and a common path 23 is provided for supplying ink to all the pressure chambers 21. Items 24 are supply ports for supplying ink to the ink chambers. The pressure chambers 21 are separated from one another by intervening partition walls 22. The pressure chamber substrate 21 is provided with a vibration plate 30A on the base 25 side. The wiring from the piezoelectric thin film elements is made to converge in a wiring base plate that is a flexible cable and connected to external circuitry.

A nozzle plate 10A is joined to the pressure chamber 20A. Nozzles 11 are formed in the nozzle plate at positions corresponding to the pressure chambers 21 for discharging ink drops. The base 25 is a rigid body made of steel, etc. or the like to provide an attachment base for the pressure chamber substrate 20A.

Figure 4:
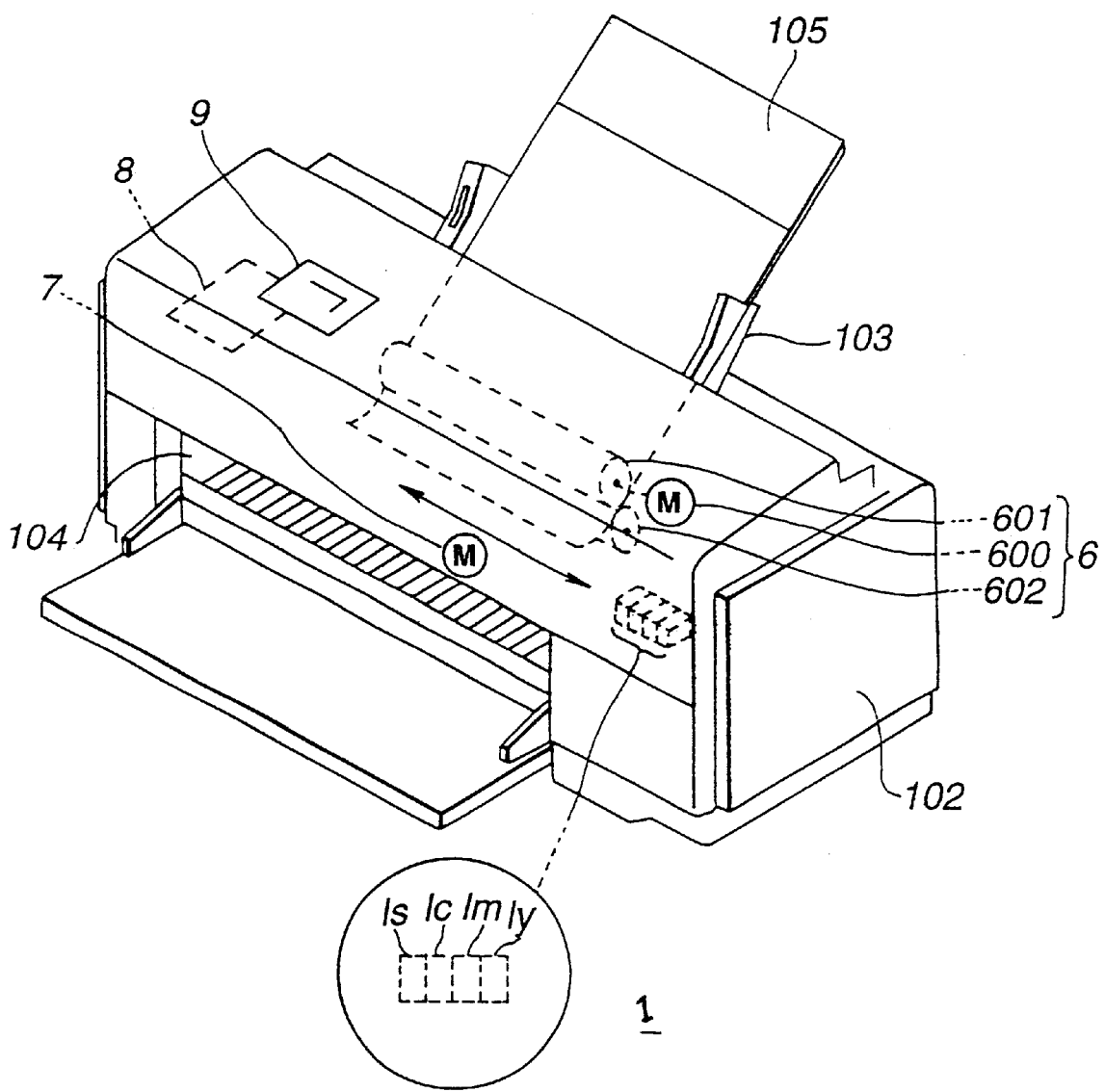
FIG. 4 is a diagonal view of an ink jet printer.

Next, the structure of a printer that uses an ink jet recording head having the piezoelectric element diagramed in FIG. 3 is described in FIG. 4. The printer is made so that it can function as a line printer, provided with a main body 102, a tray 103, an ejection slot 104, and various operating buttons 9. An ink jet recording head, a feed mechanism 6, and a control circuit 8 are provided inside the main body.

The ink jet recording head comprises the piezoelectric element described above. This head, being a head that is specially made for use in line printers, is formed in a length that extends across the entire width of the paper used 105. The ink jet recording head is configured so that it can discharge ink from nozzles provided across the entire width of the paper, in response to discharge signals provided from the control circuit.

The feed mechanism comprises a motor 600 and such mechanical structures as rollers 601 and 602. The motor is made so that it can turn in response to drive signals Sd supplied from the control circuit. The mechanical structures are configured such that they can transmit the turning force of the motor to the rollers. The rollers are made so that they turn when the turning force of the motor is transmitted thereto. When the rollers turn, paper loaded in the tray is pulled in, which is fed so that it can be printed by the head.

The control circuit comprises a CPU, ROM, RAM, and interface circuitry, etc. This control circuit is made so that, in response to printing information supplied via a connector from a computer, it can supply drive signals to the feed mechanism and supply discharge signals to the inkjet recording head. The control circuit is also made so that it can set operating modes and perform reset processes in response to operating signals from the operating panel.

As described in the foregoing, the present invention provides a piezoelectric thin film element wherein the desired composition is obtained, that exhibits good piezoelectric distortion characteristics, and that functions well as an actuator.

The present invention also provides a piezoelectric thin film element that exhibits the desired film thickness without cracks developing in the piezoelectric thin film layer. The present invention, furthermore, provides a piezoelectric thin film element wherewith there is no danger of deficiencies developing in the piezoelectric film. The present invention, moreover, provides an ink jet recording head that uses this piezoelectric thin film element, and an ink jet printer that uses that recording head.

What is claimed is:

1. A method of fabricating a piezoelectric thin film element made by forming a lower electrode layer, a piezoelectric thin film layer, and an upper electrode layer on a substrate, comprising:

forming a piezoelectric precursor thin film layer on said lower electrode;

forming a mask pattern on said precursor thin film layer; and applying a heating solution to said substrate for the purpose of hydrothermal processing, thereby selectively crystallizing areas in said precursor thin film layer where said mask pattern is not formed to obtain said piezoelectric thin film layer.

2. The method according to claim 1, wherein, after forming said lower electrode layer on said substrate, seeds are formed consisting of an element configuring said piezoelectric thin film or an oxide thereof, or seed layer containing said seeds is formed, to promote the crystallization of said precursor, on which said precursor thin film layer is then formed.

3. The method according to claim 1, wherein seeds consisting of an element configuring said piezoelectric thin film or an oxide thereof are mixed into said precursor thin film.

4. The method according to claim 1, wherein an element configuring said piezoelectric thin film or an oxide thereof, is contained in said heating solution, and said precursor thin film is crystallized in said heating solution.

5. The method according to claim 1, wherein said heating solution is an aqueous alkaline solution used in said hydrothermal processing.

6. A method of fabricating a piezoelectric thin film element made by forming a lower electrode layer, a piezoelectric thin film layer, and an upper electrode layer on a substrate, comprising:

laminating a precursor thin film layer on said lower electrode using a precursor sol for forming said precursor that exhibits photosensitivity;

selectively exposing said precursor thin film layer to light;

patterning said precursor thin film layer after exposing it to light; and applying a heating solution to said substrate for the purpose of hydrothermal processing thereby selectively crystallizing said precursor thin film layer.

7. The method according to claim 6, wherein said precursor sol is a mixture of a liquid photosensitive resist and a sol for forming said precursor thin film.

8. A method of fabricating a piezoelectric thin film element made by forming a lower electrode layer, a piezoelectric thin film layer, and an upper electrode layer on a substrate, comprising:

forming a piezoelectric precursor thin film layer on said lower electrode and subjecting said piezoelectric precursor thin film layer to patterning;

after forming said precursor thin film layer on said lower electrode, forming seeds consisting of an element configuring said piezoelectric thin film or an oxide thereof, or a seed layer containing said seeds, to promote the crystallization of said precursor thereon; and applying a heating solution to said substrate for the purpose of hydrothermal processing, thereby selectively crystallizing said precursor thin film.

9. A method of fabricating a piezoelectric thin film element made by forming a lower electrode layer, a piezoelectric thin film layer, and an upper electrode layer on a substrate, comprising:

forming a plurality of piezoelectric precursor thin film layers and subjecting said piezoelectric precursor thin film layers to patterning, wherein seeds are formed consisting of an element configuring said piezoelectric thin film or an oxide thereof, or a seed layer containing said seeds is formed, to promote the crystallization of said precursor, between said precursor thin film layers; and applying a heating solution to said substrate for the purpose of hydrothermal processing, thereby selectively crystallizing said precursor thin film layers to obtain said piezoelectric thin film layer.

* * * * *